(12) United States Patent
Cho et al.

(10) Patent No.: US 9,349,677 B2
(45) Date of Patent: *May 24, 2016

(54) STACKED HALF-BRIDGE PACKAGE WITH A COMMON LEADFRAME

(71) Applicant: International Rectifier Corporation, El Segundo, CA (US)

(72) Inventors: Eung San Cho, Torrance, CA (US); Chuan Cheah, Torrance, CA (US); Andrew N. Sawle, East Grinstead (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 475 days.

This patent is subject to a terminal disclaimer.

(21) Appl. No.: 13/866,744

(22) Filed: Apr. 19, 2013

(65) Prior Publication Data
US 2013/0228794 A1 Sep. 5, 2013

Related U.S. Application Data

(63) Continuation of application No. 13/278,695, filed on Oct. 21, 2011, now Pat. No. 8,426,952.

(60) Provisional application No. 61/461,110, filed on Jan. 14, 2011.

(51) Int. Cl.
*H01L 23/495* (2006.01)
*H01L 23/00* (2006.01)
*H01L 23/31* (2006.01)

(52) U.S. Cl.
CPC .... *H01L 23/49562* (2013.01); *H01L 23/49524* (2013.01); *H01L 23/49575* (2013.01); *H01L 24/36* (2013.01); *H01L 24/40* (2013.01); *H01L 23/3107* (2013.01); *H01L 2224/32245* (2013.01);

(Continued)

(58) Field of Classification Search
CPC ............... H01L 23/49541; H01L 2224/48247; H01L 25/072; H01L 24/37
USPC .......................... 257/666, 686, 723, 724, 735
See application file for complete search history.

(56) References Cited

U.S. PATENT DOCUMENTS 7,295,453 B2 11/2007 Shiraishi
7,618,896 B2 11/2009 Joshi (Continued)

FOREIGN PATENT DOCUMENTS

DE 10 2005 055 761 5/2007
DE 10 2009 006 152 7/2009

OTHER PUBLICATIONS

U.S. Appl. No. 61/461,110, filed Jan. 14, 2011, Cho.

*Primary Examiner* — S. V. Clark
(74) *Attorney, Agent, or Firm* — Farjami & Farjami LLP (57) ABSTRACT

According to an exemplary embodiment, a stacked half-bridge package includes a control transistor having a control drain for connection to a high voltage input, a control source coupled to an output terminal, and a control gate for being driven by a driver IC. The stacked half-bridge package further includes a sync transistor having a sync drain for connection to the output terminal, a sync source coupled to a low voltage input, and a sync gate for being driven by the driver IC. The control and sync transistors are stacked on opposite sides of a common conductive leadframe with the common conductive leadframe electrically and mechanically coupling the control source with the sync drain. The common conductive leadframe thereby serves as the output terminal.

20 Claims, 5 Drawing Sheets (52) U.S. Cl.
CPC .............. *H01L 2224/37147* (2013.01); *H01L 2224/40095* (2013.01); *H01L 2224/40245* (2013.01); *H01L 2224/40247* (2013.01); *H01L 2224/73263* (2013.01); *H01L 2924/1306* (2013.01); *H01L 2924/13064* (2013.01); *H01L 2924/13091* (2013.01); *H01L 2924/181* (2013.01)

(56) References Cited

U.S. PATENT DOCUMENTS

| | | | |
|---|---|---|---|
| 7,675,148 B2 | 3/2010 | Lim | |
| 7,843,044 B2 | 11/2010 | Takahashi | |
| 7,902,809 B2 | 3/2011 | Briere | |
| 7,936,054 B2 | 5/2011 | Eom | |
| 8,062,932 B2 | 11/2011 | Hebert | |
| 8,253,224 B2 | 8/2012 | Hu | |
| 8,299,588 B1 | 10/2012 | Tateishi | |
| 8,426,952 B2 * | 4/2013 | Cho | H01L 23/49524 257/666 |
| 8,431,927 B2 | 4/2013 | Kim | |
| 8,674,670 B2 | 3/2014 | Briere | |
| 8,860,194 B2 * | 10/2014 | Ma | H01L 25/18 257/676 |
| 2006/0169976 A1 | 8/2006 | Kameda | |
| 2008/0061396 A1 * | 3/2008 | Havanur | H01L 23/49562 257/500 |
| 2009/0108467 A1 | 4/2009 | Otremba | |
| 2009/0141203 A1 | 6/2009 | Son | |
| 2009/0160036 A1 * | 6/2009 | Grey | H01L 23/49503 257/666 |
| 2009/0315026 A1 | 12/2009 | Jeong | |
| 2010/0171543 A1 | 7/2010 | Korec | |
| 2010/0279470 A1 * | 11/2010 | Grey | H01L 23/49503 438/123 |
| 2012/0168926 A1 | 7/2012 | Cho | |
| 2012/0181996 A1 * | 7/2012 | Gehrke | H01L 23/49524 323/271 |

* cited by examiner

STACKED HALF-BRIDGE PACKAGE WITH A COMMON LEADFRAME

This is a continuation of application Ser. No. 13/278,695 filed Oct. 21, 2011.

The present application claims the benefit of and priority to a pending provisional application titled "Stacked Packaging Architecture with Reduced Form Factor and Increased Current Density with Application to Power Transistor Packaging," Ser. No. 61/461,110 filed on Jan. 14, 2011. The disclosure in that pending provisional application is hereby incorporated fully by reference into the present application.

Moreover, application Ser. No. 11/986,848, filed on Nov. 27, 2007, titled "DC/DC Converter Including a Depletion Mode Power Switch," now U.S. Pat. No. 7,902,809; and pending application Ser. No. 12/928,102, filed on Dec. 3, 2010, titled "DC/DC Converter with Depletion-Mode III-Nitride Switches," and Ser. No. 12/927,341, filed on Nov. 12, 2010, titled "Semiconductor Package with Metal Straps," are hereby incorporated fully by reference into the present application.

BACKGROUND OF THE INVENTION

1. Field of the Invention

The present invention relates generally to semiconductor devices. More particularly, the present invention relates to packaging of semiconductor devices.

2. Background Art

To allow for high efficiency power conversion, power converters, such as buck converters, commonly employ power switching circuits in which a high side power transistor and a low side power transistor are connected to form a half-bridge. One such power converter that is frequently employed is a synchronous buck converter, where the high side transistor is a control transistor and the low side transistor is a synchronous transistor. The control transistor and the synchronous transistor are typically formed on their respective separate dies, i.e. a control transistor die and a synchronous transistor die, that are connected in a package (i.e. co-packaged) to form the half-bridge.

One approach to connecting the control transistor and the synchronous transistor in a package would be to arrange the control transistor and the synchronous transistor side by side on a substrate, such as a printed circuit board (PCB). However, this arrangement would result in the package having a large footprint, as the package must be large enough to accommodate footprints of the control transistor and the synchronous transistor. Furthermore, conductive traces on the PCB could be used to connect the control transistor and the synchronous transistor so as to form the half-bridge package. However, the conductive traces would form long routing paths on the PCB, causing high parasitic inductance and resistance. Thus, this approach to packaging the control transistor and the synchronous transistor would result in a package having a large form factor where the package significantly degrades performance of the half-bridge.

What is needed is an approach to packaging control and synchronous transistors that is capable of achieving packages having a small form factor where the packages do not significantly degrade performance of the half-bridge.

SUMMARY OF THE INVENTION

A stacked half-bridge package with a common conductive leadframe, substantially as shown in and/or described in connection with at least one of the figures, and as set forth more completely in the claims.

DETAILED DESCRIPTION OF THE INVENTION

The present application is directed to a stacked half-bridge package with a common conductive leadframe. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
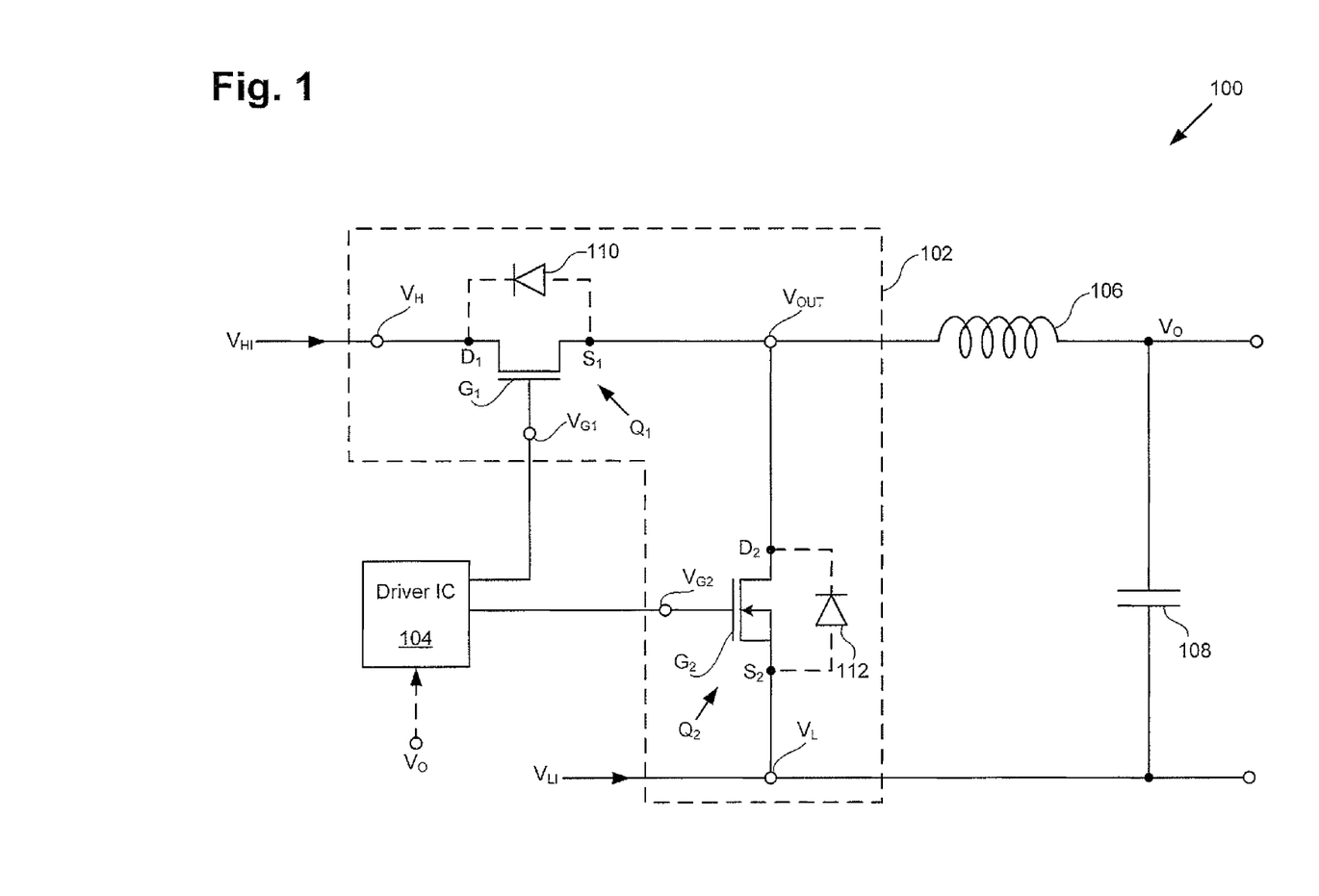
FIG. 1 shows an exemplary circuit schematic of a synchronous buck converter, according to one embodiment of the invention.

FIG. 1 shows an exemplary circuit schematic of synchronous buck converter 100 including half-bridge 102, which is formed in a stacked half-bridge package according to an embodiment of the invention, and is thus also referred to as "stacked half-bridge package" 102 or "half-bridge package" 102 in the present application. Synchronous buck converter 100 also includes, driver integrated circuit (IC) 104, output inductor 106, and output capacitor 108.

Half-bridge package 102 includes control transistor $Q_1$ and synchronous transistor $Q_2$ (also referred to as "sync transistor"), high voltage input terminal $V_H$, low voltage input terminal $V_L$, output terminal $V_{out}$, control gate terminal $V_{G1}$, and sync gate terminal $V_{G2}$.

In half-bridge package 102, high voltage input terminal $V_H$ receives high voltage input $V_{H1}$ which can be, for example, a direct current (DC) voltage. Low voltage input terminal $V_L$ receives low voltage input $V_{L1}$, which can be, for example, ground. Also in half-bridge package 102, control gate terminal $V_{G1}$ receives a control gate signal from driver IC 104 for driving control transistor $Q_1$. Similarly, sync gate terminal $V_{G2}$ receives a sync gate signal from driver IC 104 for driving sync transistor $Q_2$. Driver IC 104 may drive control transistor $Q_1$ and sync transistor $Q_2$ utilizing any suitable method. As a specific example, in one embodiment, driver IC 104 can vary a duty cycle of the sync and control gate signals responsive to a measurement of output voltage $V_O$ of synchronous buck converter 100 to maintain a desired output voltage $V_O$, regardless of changes in high voltage input $V_{H1}$. It will be appreciated that in other embodiments, output voltage $V_O$ is not measured in synchronous buck converter 100.

Control transistor $Q_1$ includes control source $S_1$, control drain $D_1$, and control gate $G_1$. Sync transistor $Q_2$ includes sync source $S_2$, sync drain $D_2$, and sync gate $G_2$. In various embodiments of the present invention, control transistor $Q_1$ and sync transistor $Q_2$ can be any combination of an enhancement more transistor and a depletion mode transistor. For example, in one embodiment, control transistor $Q_1$ and sync transistor $Q_2$ are both depletion mode transistors. Control transistor $Q_1$ and sync transistor $Q_2$ can be P-channel or N-channel transistors. Also, control transistor $Q_1$ and sync transistor $Q_2$ can be field-effect transistors (FETs). In one embodiment, at least one of control transistor $Q_1$ and sync transistor $Q_2$ is a silicon FET. However, at least one of control transistor $Q_1$ and sync transistor $Q_2$ may also comprise a non-silicon FET or any other FET in general. In one embodiment, at least one of control transistor $Q_1$ and sync transistor $Q_2$ is a metal-oxide-semiconductor field-effect transistor (MOSFET). At least one of control transistor $Q_1$ and sync transistor $Q_2$ can also be, as an example, a high electron mobility transistor (HEMT), such as a GaN HEMT.

Control transistor $Q_1$ has control drain $D_1$ for connection to high voltage input $V_{HI}$ through high voltage input terminal $V_H$ of half-bridge package 102. Control transistor $Q_1$ also has control source $S_1$ coupled to output terminal $V_{OUT}$ of half-bridge package 102. Also, control transistor $Q_1$ has control gate $G_1$ coupled to control gate terminal $V_{G1}$ of half-bridge package 102 for being driven by driver IC 104.

Sync transistor $Q_2$ has sync drain $D_2$ for connection to output terminal $V_{OUT}$ of half-bridge package 102. Sync transistor $Q_2$ also has sync source $S_2$ coupled to low voltage input $V_{LI}$ through low voltage input terminal $V_L$ of half-bridge package 102. Also, sync transistor $Q_2$ has sync gate $G_2$ coupled to sync gate terminal $V_{G2}$ of half-bridge package 102 for being driven by driver IC 104.

In some embodiments, at least one of control transistor $Q_1$ and sync transistor $Q_2$ can be connected to a diode. For example, FIG. 1 shows optional diodes 110 and 112. In the embodiment shown in FIG. 1, diode 110 is coupled to control source $S_1$ and control drain $D_1$, such that diode 110 is in parallel with control transistor $Q_1$. Similarly, diode 112 is coupled to sync source $S_2$ and sync drain $D_2$, such that diode 112 is in parallel with control transistor $Q_2$. In some embodiments, at least one of diodes 110 and 112 can be connected with a reverse polarity to that shown in FIG. 1. In various embodiments, diodes 110 and 112 can be internal to or external to control transistor $Q_1$ and sync transistor $Q_2$. As an example, in one embodiment, control transistor $Q_1$ and sync transistor $Q_2$ are MOSFETs and diodes 110 and 112 are respective body diodes of control transistor $Q_1$ and sync transistor $Q_2$.

Control transistor $Q_1$ and sync transistor $Q_2$ are commonly included on respective dies (i.e. a control transistor die and a synchronous transistor die). The respective dies may include other components, for example, diode 110 may be on the control transistor die and diode 112 may be on the synchronous transistor die. These other components may also be provided external to the respective dies and can be, for example, on a different die.

Synchronous buck converter 100 illustrates one power converter, which can benefit from including stacked half-bridge package 102, in accordance with embodiments of the present invention. However, half-bridge package 102 is not limited to being included in a synchronous buck converter and can be included in other types of power converters.

In accordance with embodiments of the present invention, control transistor $Q_1$ and sync transistor $Q_2$ can be connected in a stacked half-bridge package, which includes stacked half-bridge package 102, while achieving a small footprint with low parasitic inductance and resistance. Thus, the stacked half-bridge package can have a small form factor where the stacked half-bridge package does not significantly degrade performance of half-bridge 102.

Figure 2A:
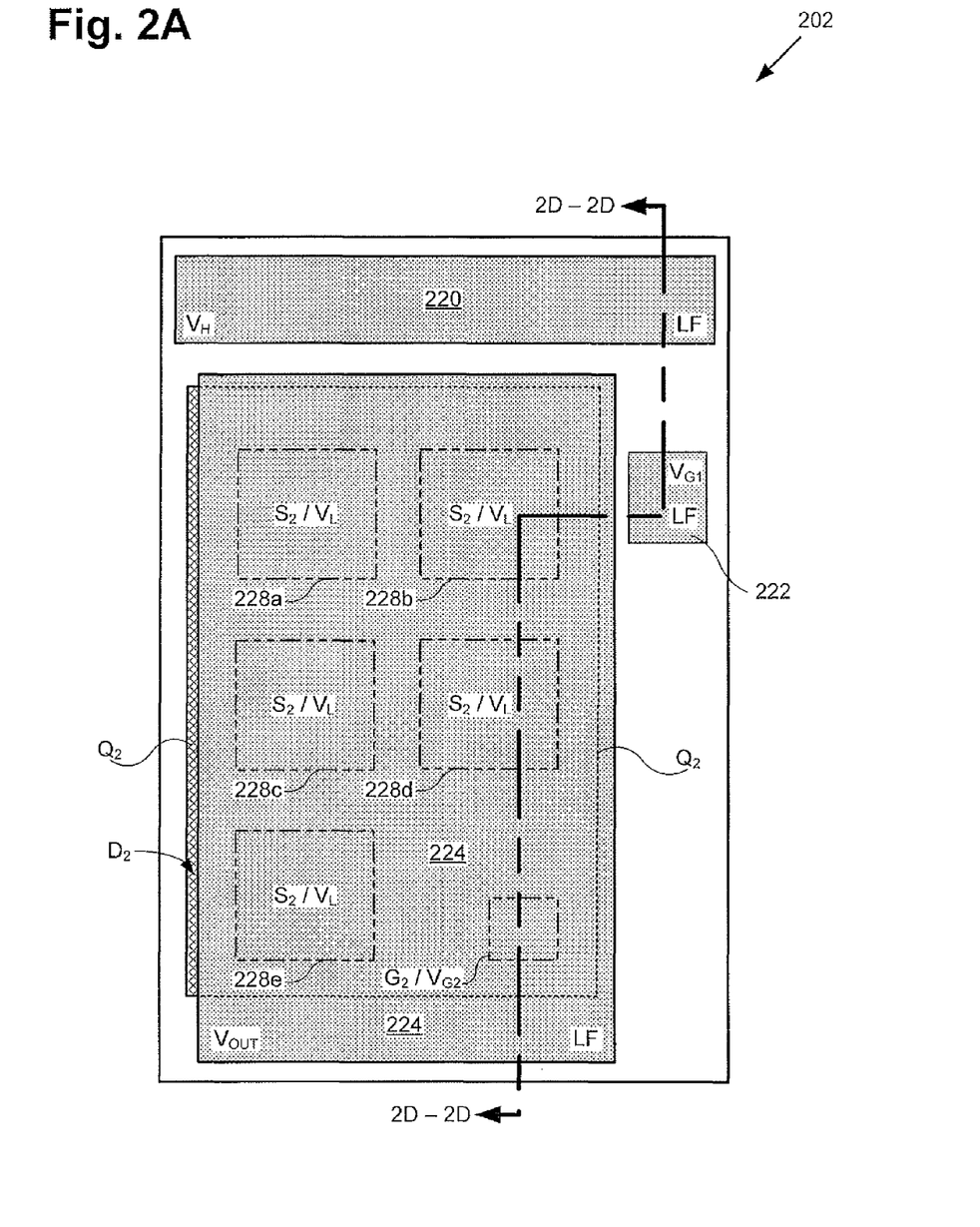
FIG. 2A illustrates a selective top view of a stacked half-bridge package, according to one embodiment of the invention.
Figure 2B:
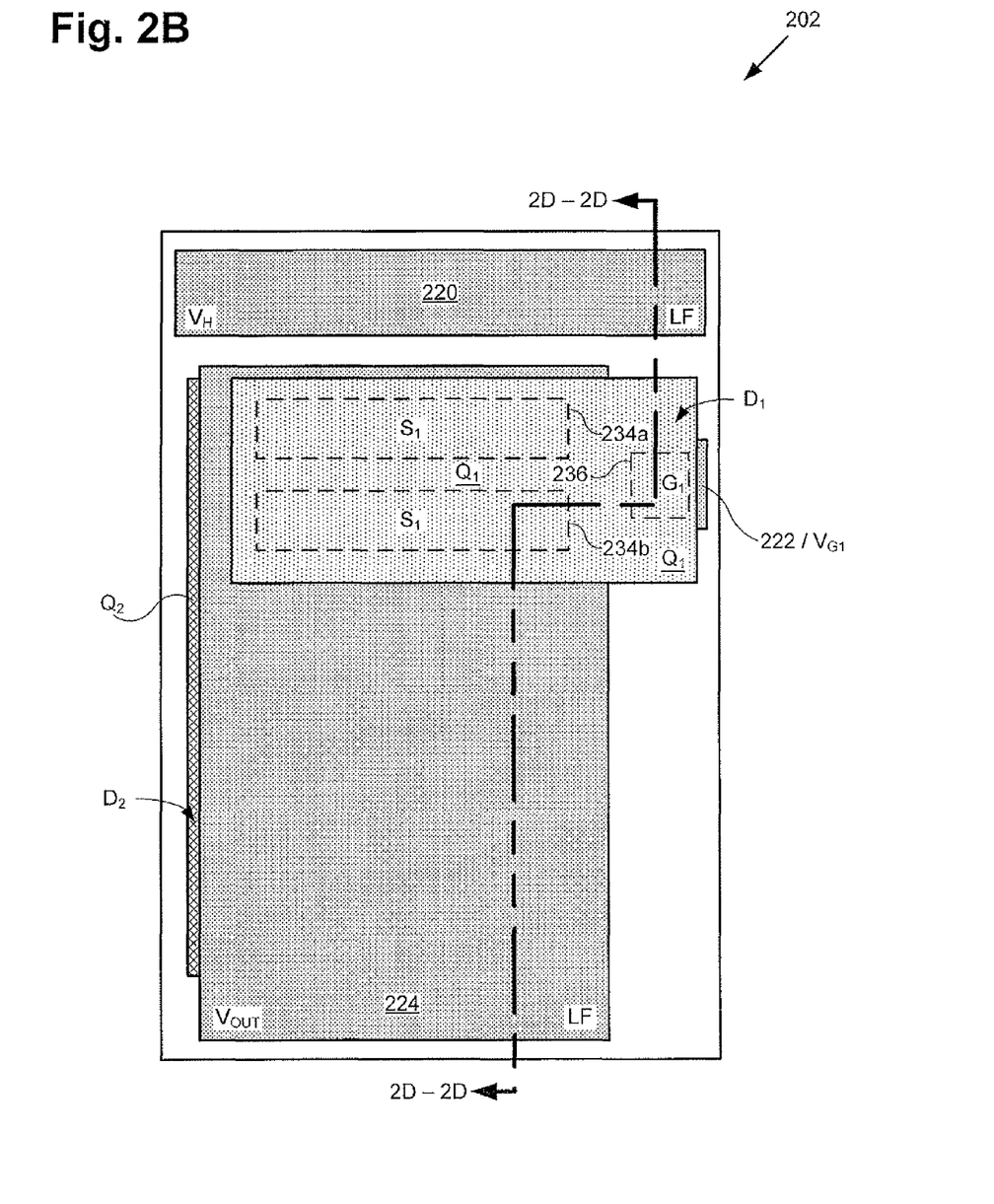
FIG. 2B illustrates a selective top view of a stacked half-bridge package, according to one embodiment of the invention.
Figure 2C:
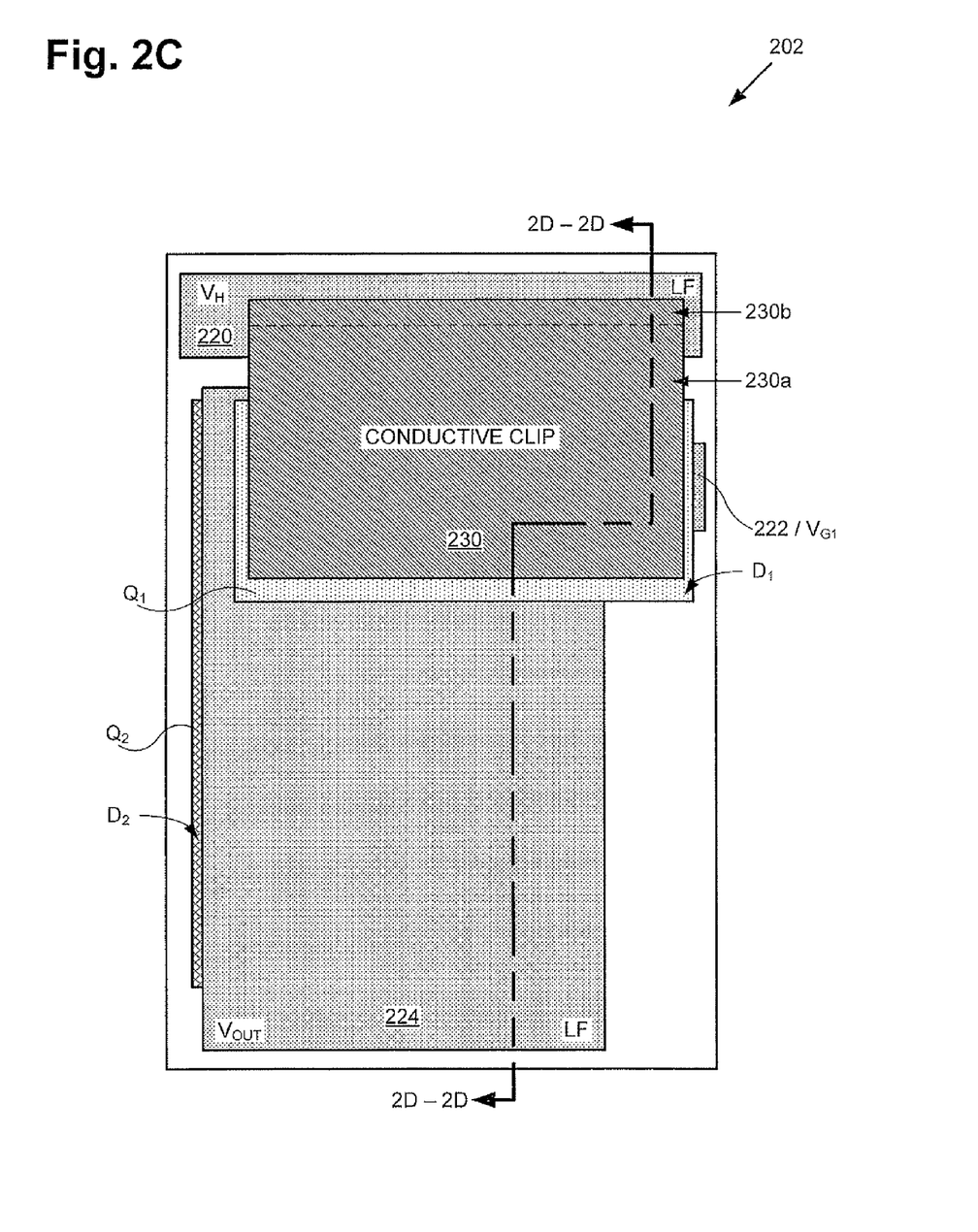
FIG. 2C illustrates a selective top view of a stacked half-bridge package, according to one embodiment of the invention.
Figure 2D:
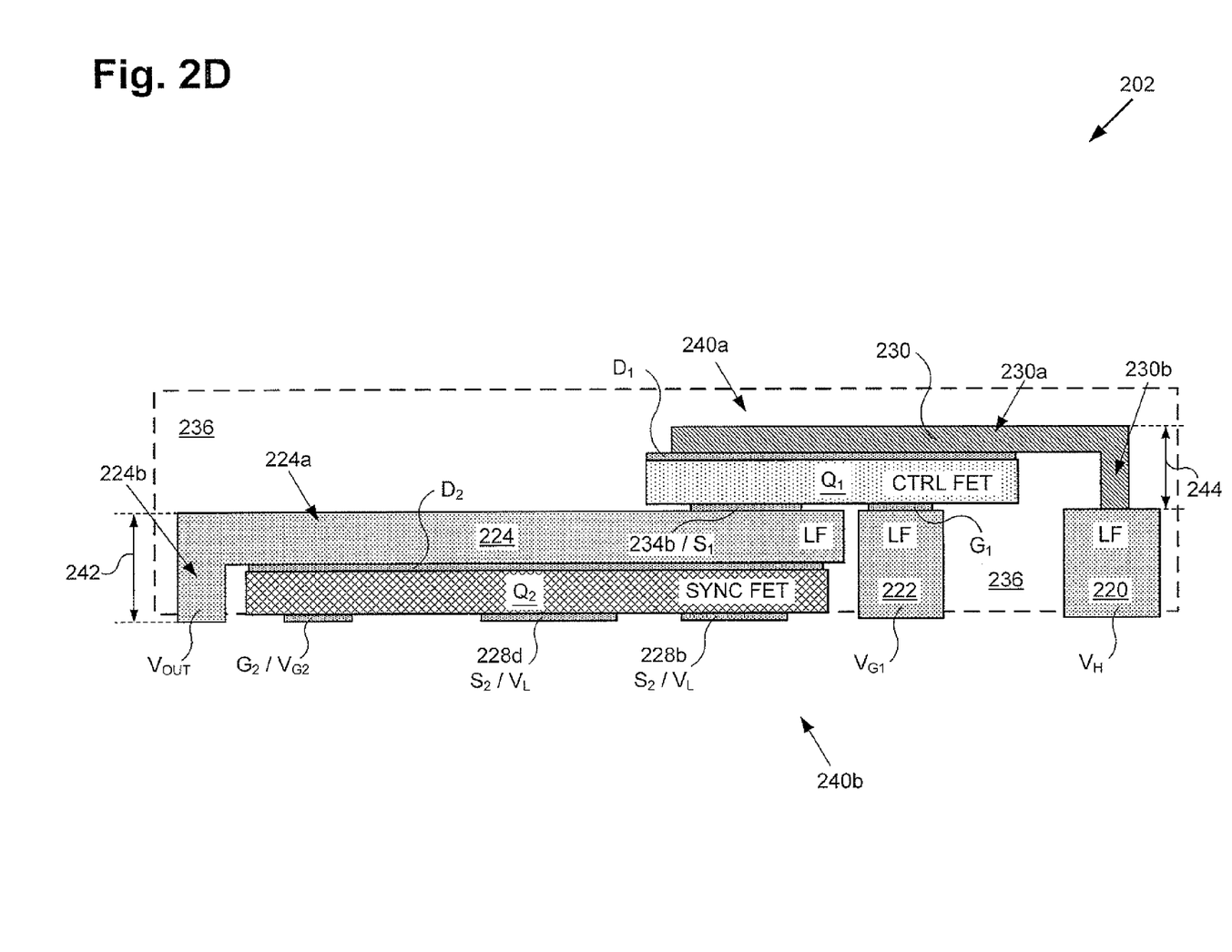
FIG. 2D illustrates a cross sectional view of a portion of a stacked half-bridge package, according to one embodiment of the invention.

FIGS. 2A-2C illustrate selective top views of stacked half-bridge package 202, corresponding to stacked half-bridge package 102 in FIG. 1, in accordance with one embodiment of the present invention. Various features of stacked half-bridge package 202 are not shown in FIGS. 2A-2C for clarity of description. FIG. 2D illustrates a cross sectional view of a portion of stacked half-bridge package 202, according to one embodiment of the invention. The cross sectional view shown in FIG. 2D corresponds to a cross section along line 2D-2D in FIGS. 2A-2C.

FIG. 2A shows control drain leadframe 220, control gate leadframe 222, common conductive leadframe 224, and sync transistor $Q_2$ of stacked half-bridge package 202. Sync transistor $Q_2$ in FIGS. 2A-2D corresponds to sync transistor $Q_2$ in FIG. 1. Common conductive leadframe 224 is over sync transistor $Q_2$. In FIG. 2A, dashed lines indicate portions of synch transistor $Q_2$ that would not otherwise be visible, as they are covered by common conductive leadframe 224. For example, an outline of synch transistor $Q_2$, which can be a semiconductor die, is depicted using a dashed line. Furthermore, sync transistor $Q_2$ includes sync source $S_2$ and sync gate $G_2$, which are depicted using dashed lines. Sync transistor $Q_2$ also includes sync drain $D_2$, a portion of which is shown in FIG. 2A, as it is not fully covered by common conductive leadframe 224 in the present embodiment.

Sync source $S_2$ in stacked half-bridge package 202 corresponds to sync source $S_2$ in FIG. 1, sync gate $G_2$ in stacked half-bridge package 202 corresponds to sync gate $G_2$ in FIG. 1, and sync drain $D_2$ in stacked half-bridge package 202 corresponds to sync drain $D_2$ in FIG. 1. In the present embodiment, sync transistor $Q_2$ has top and bottom surfaces, which are opposite one another. Sync drain $D_2$ is on the top surface and sync source $S_2$ and sync gate $G_2$ are on the bottom surface.

Also in the present embodiment, sync drain $D_2$ is provided with a sync drain pad that substantially covers an entirety of the top surface of sync transistor $Q_2$. Furthermore, sync source $S_2$ is provided with a plurality of sync source pads 228a, 228b, 228c, 228d, and 228e (also referred to collectively as "sync source pads 228"). Sync source $S_2$ is exposed for electrical connection on a bottom surface of sync transistor $Q_2$ via sync source pads 228 (See FIG. 2D) and corresponds to low voltage input terminal $V_L$ in FIG. 1. Sync source pads 228 of sync source $S_2$ can include solderable front metal (SFM) that can be used for electrical connection to sync source $S_2$.

In the present embodiment, sync gate $G_2$ is also exposed for electrical connection on a bottom surface of sync transistor $Q_2$ via a gate pad (See FIG. 2D) and corresponds to sync gate terminal $V_{G2}$ in FIG. 1. Sync gate $G_2$ can also include SFM that can be used for electrical connection to sync source $G_2$.

It is noted that in some embodiments, sync drain $D_2$, sync source $S_2$, and sync gate $G_2$ are not provided as shown in stacked half-bridge package 202. For example, sync drain $D_2$, sync source $S_2$, and sync gate $G_2$ can be provided on different surfaces of sync transistor $Q_2$ and can be provided using one or more pads arranged in any suitable manner. As one example, in some embodiments, a single sync source pad can replace sync source pads 228. It is further noted that in some embodiments, sync source $S_2$ and sync gate $G_2$ are not exposed for electrical connection as described above, and other layers or features can be connected to sync source $S_2$ and sync gate $G_2$.

Control drain leadframe 220, control gate leadframe 222, and common conductive leadframe 224 are electrically conductive and can comprise, for example, an easily solderable metal such as aluminum, and other solderable materials such as a metal alloy or a tri-metal. Common conductive leadframe 224 is over sync transistor $Q_2$ and is electrically and mechanically connected to sync drain $D_2$.

FIG. 2B is similar to FIG. 2A, with an addition of showing control transistor $Q_1$ of stacked half-bridge package 202 over common conductive leadframe 224 and sync transistor $Q_2$. Control transistor $Q_1$ in stacked half-bridge package 202 corresponds to control transistor $Q_1$ in FIG. 1. In FIG. 2B, dashed lines indicate portions of control transistor $Q_1$ that would not otherwise be visible. More particularly, control transistor $Q_1$ includes control source $S_1$ and control gate $G_1$, which are depicted using dashed lines. Control transistor $Q_1$ also includes control drain $D_1$, which is visible in FIG. 2B.

Control source $S_1$ in stacked half-bridge package 202 corresponds to control source $S_1$ in FIG. 1, control gate $G_1$ in stacked half-bridge package 202 corresponds to control gate $G_1$ in FIG. 1, and control drain $D_1$ in stacked half-bridge package 202 corresponds to control drain $D_1$ in FIG. 1. In the present embodiment, control transistor $Q_1$ has top and bottom surfaces, which are opposite one another. Control drain $D_1$ is on the top surface and control source $S_1$ and control gate $G_1$ are on the bottom surface.

In the present embodiment, control drain $D_1$ is provided with a control drain pad that substantially covers an entirety of the top surface of control transistor $Q_1$. Also in the present embodiment, control source $S_1$ is provided with a plurality of control source pads 234a and 234b (also referred to as control source pads 234). It is noted that in some embodiments, control drain $D_1$, control source $S_1$, and control gate $G_1$ are not provided as shown in stacked half-bridge package 202. Rather, control drain $D_1$, control source $S_1$, and control gate $G_1$ can be provided on different surfaces of control transistor $Q_1$ and can be provided using one or more pads arranged in any suitable manner. For example, in some embodiments, a single control source pad can replace control source pads 234.

Control transistor $Q_1$ is over common conductive leadframe 224, which is electrically and mechanically connected to control source $S_1$. Thus, control and sync transistors $Q_1$ and $Q_2$ are stacked on opposite sides of common conductive leadframe 224, with common conductive leadframe 224 electrically and mechanically coupling control source $S_1$ with sync drain $D_2$. Common conductive leadframe 224 is thereby serving as output terminal $V_{OUT}$ of stacked half-bridge package 202, corresponding to output terminal $V_{OUT}$ in FIG. 1. Advantageously, a short current path is formed between control source $S_I$ and sync drain $D_2$ that has low parasitic inductance and resistance (See FIG. 2D). As such, stacked half-bridge package 202 does not significantly degrade performance of half-bridge 102 in FIG. 1. Furthermore, stacked half-bridge package 202 has a small footprint that does not incorporate footprints of control transistor $Q_1$ and sync transistor $Q_2$ individually, thereby allowing for a small form factor.

Control transistor $Q_1$ is also over control gate leadframe 222, which is electrically and mechanically connected to control gate $G_2$. In the present embodiment, control gate leadframe 222 corresponds to control gate terminal $V_{G1}$ in FIG. 1. Control gate leadframe 222 provides electrical and mechanical connection for control gate $G_1$. FIG. 2B shows a majority of control transistor $Q_1$ being over common conductive leadframe 224, with a portion of control transistor $Q_1$ overhanging common conductive leadframe 224 so as to accommodate connection between control gate $G_1$ and control gate leadframe 222.

FIG. 2C is similar to FIG. 2B, with an addition of showing conductive clip 230 of stacked half-bridge package 202 over control transistor $Q_1$, common conductive leadframe 224 and sync transistor $Q_2$. Conductive clip 230 comprises conductive material, such as a metal or metal alloy. In one embodiment conductive clip 230 is a copper clip. Conductive clip 230 includes web portion 230a and leg portion 230b and provides connection between control drain $D_1$ and control drain leadframe 220. In FIG. 2C, a dashed line indicates a boundary of web portion 230a and leg portion 230b. In the present embodiment, control drain leadframe 220 corresponds to high voltage input terminal $V_H$ in FIG. 1 with leg portion 230b being over and electrically and mechanically connected to control drain leadframe 220 and web portion 230a being over and electrically and mechanically connected to control drain $D_1$ of control transistor $Q_1$.

As noted above, FIG. 2D illustrates a cross sectional view of a portion of stacked half-bridge package 202 corresponding to a cross section along line 2D-2D in FIGS. 2A-2C. FIG. 2D shows hermetic sealant 236, which is optional as indicated by dashed lines. In one embodiment, hermetic sealant 236 is a molding compound, which encapsulates stacked half-bridge package 202. FIG. 2D shows hermetic sealant 236 leaves common conductive leadframe 224, sync gate $G_2$, sync source $S_2$, control gate leadframe 222, and control drain leadframe 220 exposed on bottomside 240b of stacked half-bridge package 202 and thus, available for electrical connection.

FIG. 2D shows that in the present embodiment, common conductive leadframe 224 has web portion 224a and leg portion 224b. Leg portion 224b is of thickness 242, which is greater than that of sync transistor $Q_2$ and web portion 224a. Furthermore, control gate leadframe 222 is of thickness 242, which is greater than that of web portion 224a of common conductive leadframe 224 and is greater than that of sync transistor $Q_1$. Similarly, control drain leadframe 220 is of thickness 244, which is greater than that of web portion 224a of common conductive leadframe 224 and is greater than that of sync transistor $Q_1$. In the present embodiment, respective bottom surfaces of sync transistor $Q_1$, leg portion 224a of common conductive leadframe 224, conductive gate leadframe 222 and conductive drain leadframe 220 can thereby be substantially flush with one another, as shown in FIG. 2D. As such, stacked half-bridge package 202 can easily be mounted on and electrically connected to a substrate (not shown in FIGS. 2A-2D).

FIG. 2D also shows that conductive clip 230 is connected to control drain $D_2$ at topside 240a of stacked half-bridge package 202. Leg portion 230b of conductive clip 230 is of thickness 244 that is greater than that of control transistor $Q_1$ and web portion 230a. In the present embodiment, respective top surfaces of control gate leadframe 222, control drain leadframe 220, and common conductive leadframe 224 can thereby be substantially flush with one another, as shown in FIG. 2D. Thus, in some embodiments, control gate leadframe 222, control drain leadframe 220, and common conductive leadframe 224 can be formed from a shared leadframe. In one embodiment, common conductive leadframe 224 is an etched or half-etched leadframe that can be formed from the shared leadframe. Etching or half-etching common conductive leadframe 224 can be used to form leg portion 224b of common conductive leadframe 224. FIG. 2D also illustrates that common conductive leadframe 224 electrically and mechanically couples the control source (source of control transistor Q1)

with the sync drain (drain of sync transistor Q2) to form the output terminal of stacked half-bridge package 202.

Thus, as described above with respect to FIGS. 1 and 2A-2D, embodiments of the present invention can provide for a stacked half-bridge package including a control transistor and a sync transistor. The control transistor and the sync transistor can advantageously be connected in a half-bridge package with low parasitic inductance and resistance. Furthermore, the control transistor and the sync transistor can be connected with the stacked half-bridge package having a small footprint. As such, among other advantages not specifically described herein, the stacked half-bridge package can have a small form factor, where the stacked half-bridge package does not significantly degrade performance of the half-bridge.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A stacked half-bridge package comprising:
   a control transistor having a control drain, a control source, and a control gate;
   a sync transistor having a sync drain, a sync source, and a sync gate;
   said control and sync transistors being stacked on opposite sides of a common leadframe, said common leadframe serving as an output terminal by coupling said control source with said sync drain.

2. The stacked half-bridge package of claim 1, wherein said common leadframe comprises a web portion and a leg portion.

3. The stacked half-bridge package of claim 1, wherein respective bottom surfaces of said sync transistor and a leg portion of said common leadframe are substantially flush with one another.

4. The stacked half-bridge package of claim 1, wherein a conductive clip provides connection between said control drain and a control drain leadframe.

5. The stacked half-bridge package of claim 1, comprising a conductive clip including a web portion that is coupled to said control drain and including a leg portion that is coupled to a control drain leadframe.

6. The stacked half-bridge package of claim 1, wherein a conductive clip is coupled to said control drain at a topside of said stacked half-bridge package.

7. The stacked half-bridge package of claim 1, wherein said sync source comprises a solderable front metal (SFM).

8. The stacked half-bridge package of claim 1, wherein said sync source is exposed on a bottom surface of said sync transistor.

9. The stacked half-bridge package of claim 1, wherein said sync gate is exposed on a bottom surface of said sync transistor.

10. The stacked half-bridge package of claim 1, wherein said control transistor has top and bottom surfaces, said control drain being on said top surface and said control source and said control gate being on said bottom surface.

11. The stacked half-bridge package of claim 1, wherein said sync transistor has top and bottom surfaces, said sync drain being on said top surface and said sync source and said sync gate being on said bottom surface.

12. A stacked half-bridge package comprising:
   a control GaN HEMT having a control drain, a control source, and a control gate;
   a sync GaN HEMT having a sync drain, a sync source, and a sync gate;
   said control and sync GaN HEMTs being stacked on opposite sides of a common leadframe, said common leadframe serving as an output terminal by coupling said control source with said sync drain.

13. The stacked half-bridge package of claim 12, wherein said common leadframe comprises a web portion and a leg portion.

14. The stacked half-bridge package of claim 12, wherein respective bottom surfaces of said sync GaN HEMT and a leg portion of said common leadframe are substantially flush with one another.

15. The stacked half-bridge package of claim 12, wherein a conductive clip provides connection between said control drain and a control drain leadframe.

16. The stacked half-bridge package of claim 12, comprising a conductive clip including a web portion that is coupled to said control drain and including a leg portion that is coupled to a control drain leadframe.

17. The stacked half-bridge package of claim 12, wherein a conductive clip is coupled to said control drain at a topside of said stacked half-bridge package.

18. The stacked half-bridge package of claim 12, wherein said sync source comprises a solderable front metal (SFM).

19. The stacked half-bridge package of claim 12, wherein said sync source is exposed on a bottom surface of said sync GaN HEMT.

20. The stacked half-bridge package of claim 12, wherein said sync gate is exposed on a bottom surface of said sync GaN HEMT.

* * * * *